(12) United States Patent
Le-Gall (10) Patent No.: US 7,487,055 B2
(45) Date of Patent: Feb. 3, 2009

(54) ESTIMATING OF THE JITTER OF A CLOCK SIGNAL

(75) Inventor: Hervé Le-Gall, Saint Martin D'Uriage (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/729,016

(22) Filed: Mar. 27, 2007

(65) Prior Publication Data
US 2007/0229326 A1    Oct. 4, 2007

(30) Foreign Application Priority Data
Mar. 28, 2006    (FR) .................................... 06 51065

(51) Int. Cl.
*G06F 19/00*    (2006.01)
*H04B 3/46*    (2006.01)
(52) U.S. Cl. .......................................... 702/89; 375/224
(58) Field of Classification Search .................... 702/69, 702/89; 375/371, 373, 224
See application file for complete search history.

(56) References Cited

U.S. PATENT DOCUMENTS

| | | | | |
|---|---|---|---|---|
| 5,663,970 A | | 9/1997 | Bae | 371/61 |
| 5,670,901 A | | 9/1997 | Yoshida | 327/148 |
| 5,898,707 A | * | 4/1999 | Takabayashi | 714/781 |
| 5,930,275 A | | 7/1999 | Horst | 371/62 |
| 2002/0044325 A1 | * | 4/2002 | Noguti | 359/189 |
| 2007/0121714 A1 | * | 5/2007 | Baker et al. | 375/224 |

* cited by examiner

*Primary Examiner*—Bryan Bui
(74) *Attorney, Agent, or Firm*—Lisa K. Jorgenson; Timothy L. Boller; Seed IP Law Group PLLC (57) ABSTRACT

A method and a device for estimating the jitter of a first periodic signal with respect to a second periodic signal, comprising steps of: sampling the first signal by means of the second one; providing the result of the sampling to the input of a shift register triggered by the second signal; comparing at least the first two states and the last state of a current word formed from parallel outputs of the shift register with respect to a reference word; and counting the number of occurrences of the reference word within a given measurement period.

35 Claims, 4 Drawing Sheets

ESTIMATING OF THE JITTER OF A CLOCK SIGNAL

BACKGROUND OF THE INVENTION

1. Field of the Invention

The present disclosure generally relates to electronic circuits and, more specifically, to circuits comprising elements for generating one or several periodic signals.

An example of application of the present disclosure relates to integrated processors comprising a circuit for generating clock signals from a reference clock.

The present disclosure more specifically relates to the testing of the synchronization of a clock signal internally generated by an electronic circuit with respect to an internal or external reference clock.

2. Discussion of the Related Art

Figure 1:
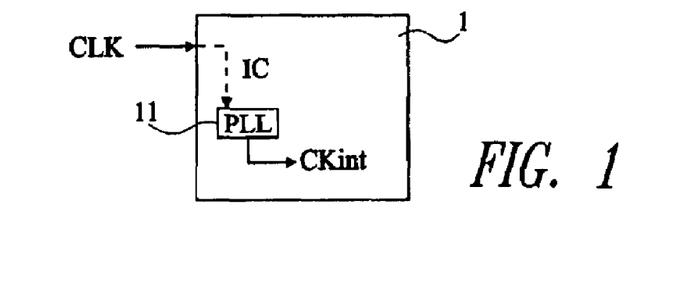
FIG. 1, previously described, very schematically and partially shows an electronic circuit of the type to which embodiments of the present invention may be applied.

FIG. 1 schematically and partially shows an example of an electronic circuit 1 of the type to which the present disclosure may be applied. Such a circuit typically comprises multiple functions not shown (especially if it is a processor) and at least one circuit 11, for example, a phase-locked loop (PLL) type, for generating at least one internal clock signal CKint from a clock signal CLK, for example, an external clock signal.

A problem present in electronic circuits driven from clock or counting signals is to make sure that such signals effectively follow an expected value, that is, undergo no significant jitter with respect to the signal from which they are generated and more generally with respect to a reference signal.

Figure 2:
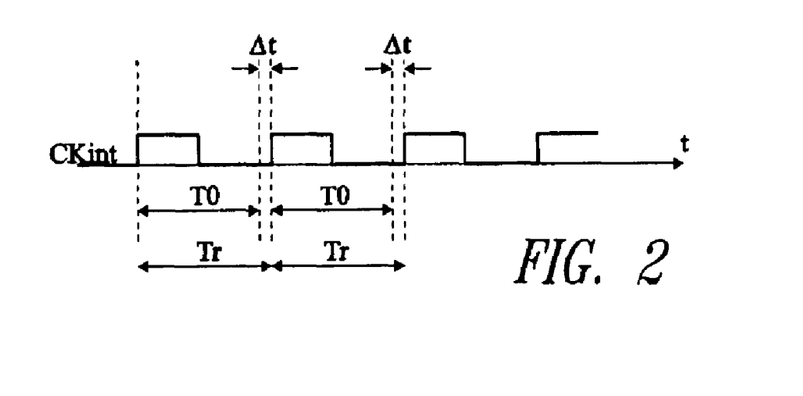
FIG. 2, previously described, is a timing diagram illustrating a clock jitter.

FIG. 2 illustrates, in a timing diagram, an example of a jitter phenomenon of a signal CKint having a real period Tr which is slightly greater than an expected period T0. Offset Δt between the two periods generates a desynchronization of clock CKint which risks causing functional problems of the circuit.

Such a noise or phase jitter is more and more critical as the signal frequency increases, since the calculation results (for example, of a counter) rapidly drift with respect to an expected value.

A first method for testing the drift of a clock signal comprises sampling the signal generated by the circuit and measuring, with an external equipment, a possibly difference with respect to a reference signal. Such a method remains accessible for relatively low frequencies (a few hundreds of kilohertz) but can no longer be used for high frequencies (several megahertz, or even hundreds or thousands of megahertz) since the noise added by the external measurement elements and the connectors to the measurement point is not negligible.

A second method comprises integrating, in the circuit to be tested, a device providing information relative to the phase shift of the internal clock signal with respect to a reference clock, to enable external exploitation of the results.

Figure 3:
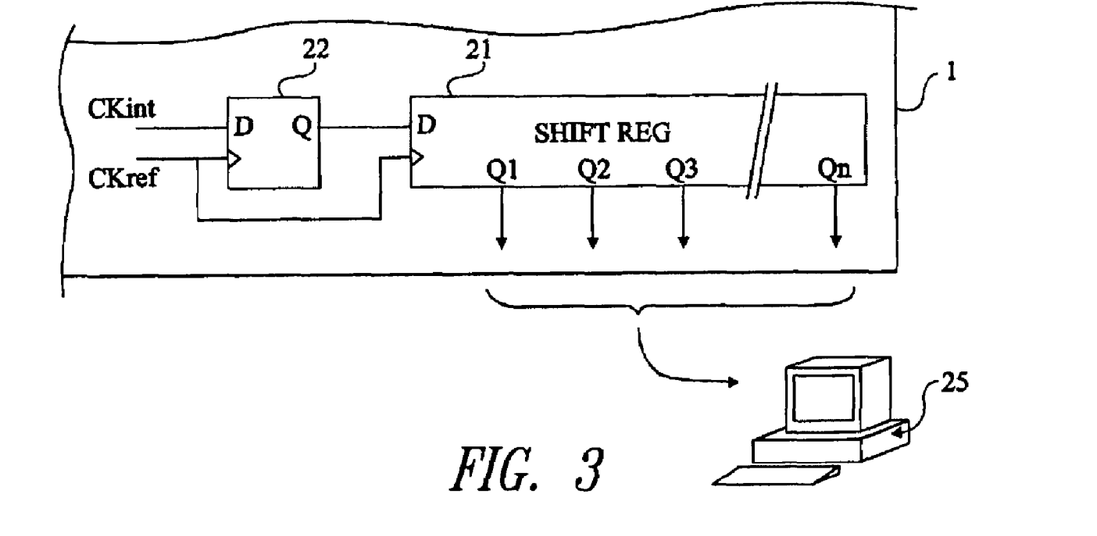
FIG. 3, previously described, is intended to expose the state of the art and the problem to solve.

FIG. 3 is a schematic block diagram illustrating a conventional example of such a device. In FIG. 3, only the measurement device integrated in circuit 1 has been shown. This device is formed of a shift register 21 based on D flip-flops having a data input receiving the output (for example, non inverted Q) of a sampling flip-flop 22. Data input D of flip-flop 22 receives internal clock signal CKint to be tested. Flip-flop 22 and shift register 21 receive, on their respective clock inputs, a signal CKref forming a reference clock of a frequency of the same order of magnitude as the signal to be measured. The n outputs Q1 to Qn of shift register 21 are provided outside of circuit 1 to a system 25 for exploiting the measurements (for example, a microcomputer). The function of shift register 21 is to parallelize the successive information on the clock edges and their possible offset, to provide information exploitable despite the high frequency.

A disadvantage of this second method is that it is necessary to load the data provided by shift register 21 into an external system to be able to exploit these data and determine a possible jitter between the two clock signals. In practice, such a device is limited to the product characterization and does not enable testing a possible clock jitter of a manufactured product, for example, in a final test before possible decision of discarding a product, or along the product lifetime.

BRIEF SUMMARY OF THE INVENTION

The present disclosure aims at overcoming all or part of the disadvantages of known clock jitter test systems.

The present disclosure more specifically aims at describing embodiments of a circuit for estimating the possible jitter of a clock signal generated by an electronic circuit with respect to a reference signal.

The present disclosure also aims at describing embodiments of a solution compatible with an integration of the test circuit in the actual electronic circuit.

The present disclosure also aims at describing embodiments of a solution compatible with the implementation of a test of the products individually after manufacturing.

To achieve all or part of these objects, as well as others, the present disclosure describes embodiments of a method for estimating the jitter of a first periodic signal with respect to a second periodic signal comprising steps of:

sampling the first signal by means of the second one;

providing the result of the sampling to the input of a shift register triggered by the second signal;

comparing at least the first two states and the last state of a current word formed from parallel outputs of the shift register with respect to a reference word; and counting the number of occurrences of the reference word within a given measurement period.

According to an embodiment, the number of occurrences is compared with a threshold and is periodically reset, the jitter being considered as acceptable as long as this threshold has not been reached.

According to an embodiment, the first and last bits of the reference word are identical, the second bit of this word being in an inverse state.

According to an embodiment, the reference word comprises between one and three first bits in a first state, between one and three next bits in a second state inverse to the first state, and between one and three last bits in the first state.

According to an embodiment, the current word provided by the shift register is compared with a second reference word inverse with respect to the first one.

According to an embodiment, the measurement period is selected according to the period of the reference clock.

According to an embodiment, the number of bits of the reference word ranges between four and twelve, preferably between five and seven.

According to an embodiment, the current word is formed of all the outputs of the shift register.

According to an embodiment, the current word is formed of a portion only of the outputs of the shift register.

The present disclosure also describes an embodiment of a device for estimating the jitter of a periodic signal with respect to a reference signal, comprising a shift register having an input receiving the periodic signal, sampled by the reference signal, comprising:

a comparator of a word formed of the parallel outputs of the shift register with respect to a reference pattern;

at least one counter of occurrences of a positive comparison provided by the first comparator; and a second comparator of the result of the occurrence counter with respect to a threshold.

In one aspect, a method for estimating jitter of a first periodic signal with respect to a second periodic signal comprises: sampling the first signal by means of the second one; providing a result of the sampling to an input of a shift register triggered by the second signal; comparing at least two first bits and a last bit of a current word formed from parallel outputs of the shift register with respect to a first reference word; and counting a number of occurrences of the first reference word within a given measurement period. In one embodiment, the number of occurrences is compared with a threshold and is periodically reset, the jitter being considered as acceptable as long as the threshold has not been reached. In one embodiment, the first and last bits of the first reference word are identical, the second bit of the first reference word being in an inverse state. In one embodiment, the first reference word comprises between one and three first bits in a first state, between one and three next bits in a second state inverse to the first state, and between one and three last bits in the first state. In one embodiment, the current word provided by the shift register is compared with a second reference word inverse with respect to the first reference word. In one embodiment, the measurement period is selected according to the period of the reference clock. In one embodiment, the number of bits of the first reference word ranges between four and twelve. In one embodiment, the number of bits of the first reference word ranges between five and seven. In one embodiment, the current word is formed of all the outputs of the shift register. In one embodiment, the current word is formed of a portion of the outputs of the shift register.

In one aspect, a device for estimating a jitter of a periodic signal with respect to a reference signal comprises: a shift register having an input receiving the periodic signal, sampled by the reference signal; a first comparator configured to compare a word formed of parallel outputs of the shift register to a reference pattern; a first counter configured to count occurrences of a positive comparison provided by the first comparator; and a second comparator configured to compare a result of the first counter to a threshold. In one embodiment, the comparator is configured to compare at least two first bits and a last bit of the word to the reference pattern. In one embodiment, the first and last bits of the reference pattern are identical, the second bit of the reference pattern being an inverse of the first bit. In one embodiment, the reference pattern comprises between one and three first bits in a first state, between one and three next bits in a second state inverse to the first state, and between one and three last bits in the first state. In one embodiment, the device further comprises: a third comparator configured to compare the word to an inverse of the reference pattern; and a second counter configured to count occurrences of a positive comparison by the third comparator, wherein the second comparator is further configured to compare a result of the second counter to the threshold. In one embodiment, the first counter is configured to periodically reset. In one embodiment, a number of bits of the reference pattern is between five and seven. In one embodiment, the word is formed of a portion of the outputs of the shift register. In one embodiment, an output of the second comparator comprises an error signal.

In one aspect, an integrated circuit comprises: means for sampling a clock signal; means for detecting a match of an output of the means for sampling to a stored data set; and means for determining whether a jitter of the clock signal with respect to a reference clock signal is acceptable. In one embodiment, the means for sampling comprises: a flip-flip; and a shift register. In one embodiment, the means for detecting a match comprises a comparator configured to compare a plurality of bits of the output of the means for sampling to the stored data set.

In one aspect, a circuit comprises: a sampler configured to sample a clock signal; a pattern detector configured to receive samples from the sampler and to detect occurrences of a pattern in the received samples; and an error detector coupled to the pattern detector and configured to generate a signal indicative of a jitter of the clock signal with respect to a reference clock signal based on an output of the pattern detector. In one embodiment, the circuit further comprises a clock generator coupled to the reference clock signal and configured to generate the clock signal. In one embodiment, the sampler comprises: a flip-flop coupled to the clock signal and the reference clock signal; and a shift registered coupled to an output of the flip-flop. In one embodiment, the sampler comprises: a plurality of flip-flops coupled together in series; and a shift register coupled to an output of the plurality of flip-flops. In one embodiment, the pattern detector is configured to compare a set of sampled bits to a set of reference bits. In one embodiment, the set of sampled bits comprises a first bit in a word of sampled bits, a second bit in the word and a last bit in the word. In one embodiment, the pattern detector is configured to determine whether a first and last portion of a word of sampled bits are in a first state and a intermediate portion of the word is in a second state, opposite of the first state. In one embodiment, the first portion has a one-bit length, the last portion has a one-bit length and the intermediate portion has a one-bit length, the intermediate portion being adjacent to the first portion. In one embodiment, the first portion has a two-bit length, the last portion has a two-bit length and the intermediate portion has a two-bit length, the intermediate portion being adjacent to the first portion. In one embodiment, the pattern detector is further configured to determine whether the first and last portion are in the second state and the intermediate portion is in the first state. In one embodiment, the signal generated by the error detector indicates the jitter is too high when a number of occurrences of the pattern exceeds a threshold number within a period of time. In one embodiment, the pattern detector is configured to detect occurrences of a second pattern in the received samples and the signal generated by the error detector indicates the jitter is too high when a number of occurrences of the second pattern exceeds the threshold number within the period of time.

In one aspect, a method of estimating a jitter of a clock signal with respect to a reference clock comprises: sampling the clock signal using the reference clock; detecting occurrences of a first pattern in samples of the clock signal; generating a signal indicating the jitter of the clock signal with respect to the reference clock is too high when a number of detected occurrences of the pattern exceeds a first threshold value within a first period of time. In one embodiment, the method further comprises: detecting occurrences of a second pattern in the samples of the clock signal; and generating the signal indicating the jitter is too high when a number of detected occurrences of the second pattern exceeds a second threshold value within a second period of time. In one embodiment, the second pattern is an inverse of the first pattern, the second threshold value equals the first threshold value and the second period of time equals the first period of time. In one embodiment, detecting occurrences of a first pattern comprises determining whether a first and last portion of a word of sampled bits are in a first state and a intermediate portion of the word is in a second state, opposite of the first state. In one embodiment, the first portion of the word has a one-bit length, the last portion of the word has a one-bit length, and the intermediate portion of the word is adjacent to the first portion of the word and has a one-bit length. In one embodiment, the first portion of the word has a three-bit length, the last portion of the word has a three-bit length, and the intermediate portion of the word is adjacent to the first portion of the word and has a three-bit length.

The foregoing and other objects, features, and advantages of embodiments of the present invention will be discussed in detail in the following non-limiting description of specific embodiments in connection with the accompanying drawings.

DETAILED DESCRIPTION OF THE INVENTION

For clarity, same elements have been designated with same reference numerals in the different drawings, unless the context indicates otherwise. Further, only those steps and elements useful to the description of the illustrated embodiments of present invention have been shown and will be described. In particular, the circuits for generating the periodic signals have not been illustrated, embodiments of the present invention being compatible with any conventional circuit for generating a periodic signal. Similarly, the portions of the concerned electronic circuit, other than the actual detection devices have not been illustrated, embodiments of the present invention being here again compatible with any conventional electronic circuit exploiting a clock signal.

The present disclosure originates from a new analysis of a clock jitter phenomenon with respect to a reference clock and, more specifically, from a statistic exploitation of the states of the measured clock signal with respect to the reference clock.

Figure 4:
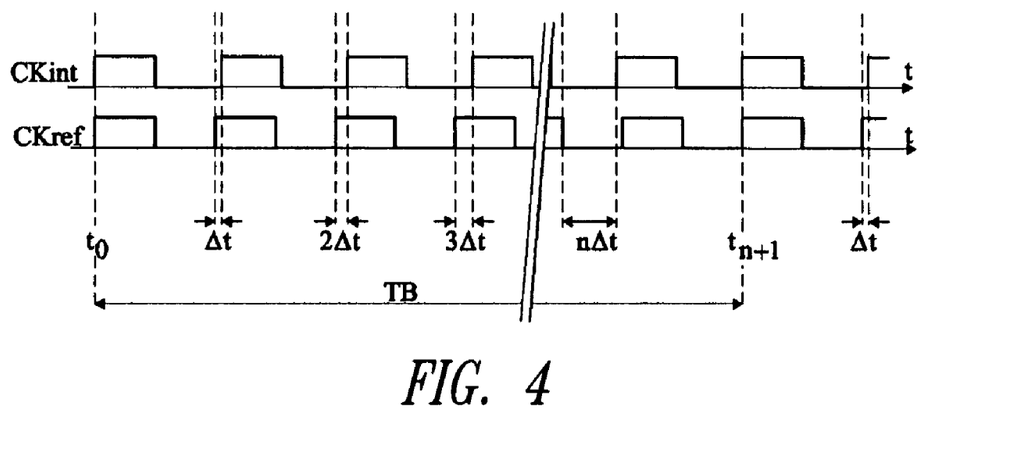
FIG. 4 illustrates in timing diagrams an example of jitter of a periodic signal generated by an electronic circuit with respect to a reference signal.

FIG. 4 illustrates, in timing diagrams showing an example of time shape of a signal CKint to be measured with respect to a reference signal CKref, an example of a phase jitter between two periodic signals. Assuming that the signals are synchronous at a time $t_0$, the phase shift of signal CKint with respect to signal CKref successively increases by a same value $\Delta t$ each clock period until the two signals become synchronous again at a time $t_{n+1}$, after n+1 periods of the reference clock signal, the signal to be measured only having, during this elapsed recovery time TB, n periods. FIG. 4 illustrates the possibility to estimate the lack of synchronism of a high-frequency clock signal based on a measurement at a lower frequency (period TB) by exploiting the fact that, even with a jitter, the signals periodically have common edges.

For simplification, the signal edges are assumed to be instantaneous. In practice, they follow a slope between the two high and low states, and conversely. This however does not change the principles of embodiments of the present invention.

Figure 5:
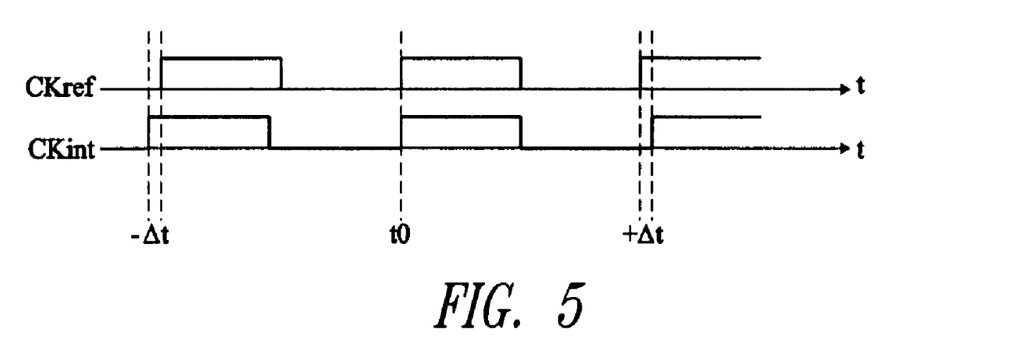
FIG. 5 is an enlargement of the timing diagrams of FIG. 4 around a time when the two signals are in phase.

FIG. 5 shows an enlargement of the timing diagrams of FIG. 4 around time $t_0$. This drawing illustrates that, if the phase shift is $+\Delta t$ in the period which follows synchronous time $t_0$ of the two signals, this phase shift is $-\Delta t$ the previous period. Accordingly, by comparing the respective states of the two signals (or by combining them by AND), the synchronized edges of the two signals are, whatever the significance of the jitter, surrounded by determined states and inverse to each other.

Figure 6:
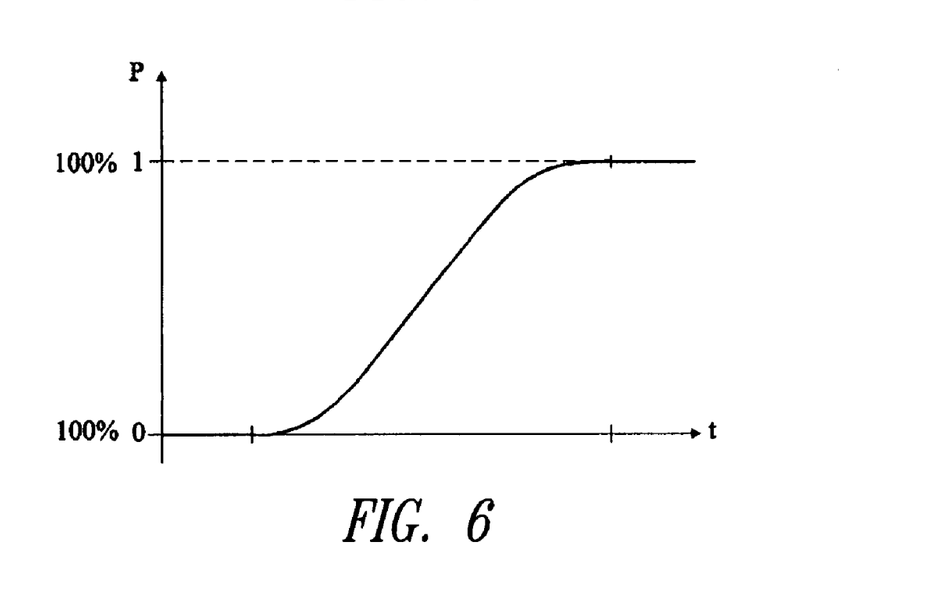
FIG. 6 shows the characteristic of cumulative probability of occurrence of a given state along time, for a clock signal generated by an electronic circuit.

FIG. 6 shows, along time t, the density of cumulative probability P of a comparison of the clock signal states along time. Since the probability to obtain a state 0 or a state 1 by comparing two non-synchronous signals follows a Gauss curve, this translates as an S-shaped cumulative distribution between times when a state 0 (phase shift in one direction) or a state 1 (phase shift in the other direction) are sure to be obtained. The notion of state 0 or 1 should be understood by comparing the two signals at sampling times.

Embodiments of the present invention may take advantage of this distribution to consider that the states which surround aligned edges of the signals to be compared are outside of this distribution and thus have determined states (respectively 0 and 1).

An embodiment of the present invention provides comparing a word contained in a shift register (parallel outputs of a series of flip-flops), driven by a reference signal and having its data input receiving the sampled signal to be measured, with a word having its first two bits or first two groups of bits having states inverted with respect to each other and having their last bit or last group of bits having a state identical to that of the first bit. Thus, embodiments of the present invention provide a reference pattern to estimate the jitter of the generated signal with respect to a reference signal. This pattern is compared with the words successively present on the outputs of the shift register and the frequency of its occurrence provides an estimate of the jitter of the clock signal to be measured with respect to the reference signal.

Embodiments of the present invention also may take advantage from the fact that, to qualify a product in terms of clock jitter, it is most often enough for its jitter to be lower than a threshold. It is thus not necessary to calculate it with accuracy and its estimate with respect to a threshold is sufficient.

Figure 7:
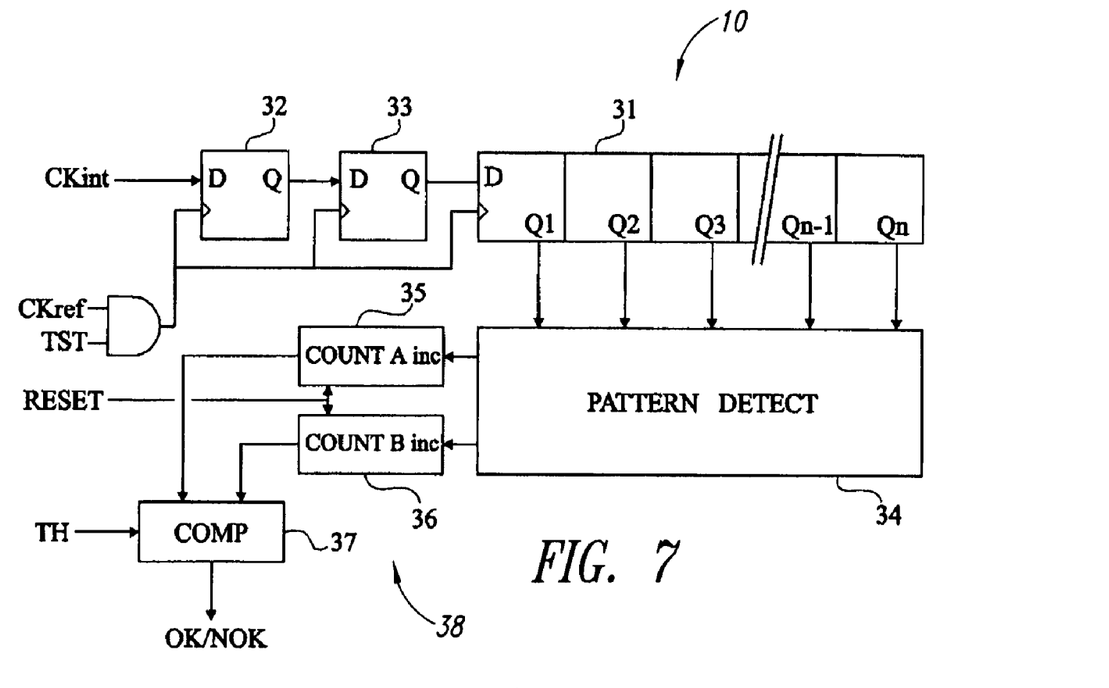
FIG. 7 is a schematic block diagram illustrating an embodiment of a circuit for estimating the jitter of a periodic signal.

FIG. 7 very schematically shows in the form of blocks an embodiment of a circuit 10 for estimating the jitter of a signal CKint generated by an electronic circuit (see FIG. 1) with respect to a reference signal CKref, the signal to be measured and the reference signal being preferably of the same order of magnitude in terms of frequency. Signal CKint is sampled by at least one first flip-flop 32 and preferably by two flip-flops 32 and 33 in series, data input D of flip-flop 33 being connected to the Q output of flip-flop 32. Signal CKref is applied to the clock inputs of flip-flops 32 and 33. A double sampling decreases the uncertainties linked to the set up time and to the hold time of the flip-flops and to the slopes of the edges of signals CKint and CKref.

The result of this sampling is applied to the input of a shift register 31 preferentially formed of D flip-flops in series having their respective outputs Q1 to Qn provided in parallel to a pattern detector 34 (PATTERN DETECT). The function of the detector is to compare the successive words of bits Q1 to Qn with at least one reference pattern. The result of the comparison performed by circuit 34 is provided to an error detector 38. In the illustrated embodiment, the result of the comparison performed by the pattern detector 34 increments, in case of a pattern identity, at least a first counter 35 (COUNT A) of the error detector 38. Preferably, the result of this counter is compared (block 37, COMP) with a threshold TH to determine whether the jitter is acceptable (OK) or not (NOK). Preferably, a second counter 36 (COUNT B) is incremented by circuit 34 based on a comparison of the pattern provided by shift register 31 with respect to an inverse reference pattern, to measure both the rising edges and the falling edges. Counters 35 and 36 may be periodically reset (signal RESET) so that threshold TH is an occurrence threshold within a time period.

Figure 8:
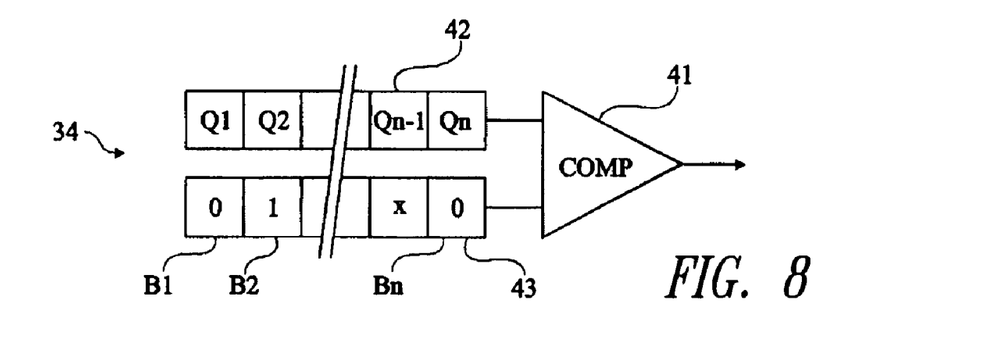
FIG. 8 schematically shows a detail of an embodiment of the circuit of FIG. 7.

FIG. 8 very schematically shows an example of a detection circuit 34 according to an embodiment. Functionally, this circuit comprises a comparator 41 (COMP) of the word Q1 to Qn provided by register 31 (possibly transiting through a temporary memorization element 42) with respect to a reference word stored, for example, in a memorization element 43 or wired in the circuit. As indicated previously, the first two bits B1 and B2 of the reference word have inverse states (for example, 0 and 1) and the last bit (Bn) has the same state as the first bit. The respective states of the intermediary bits are indifferent, that is, comparator 41 may only take into account the first two bits Q1, Q2 and B1, B2 respectively, and the last one Qn, respectively. Thus, in a simplified embodiment, not all the parallel outputs of shift register 31 are exploited.

Figure 9:
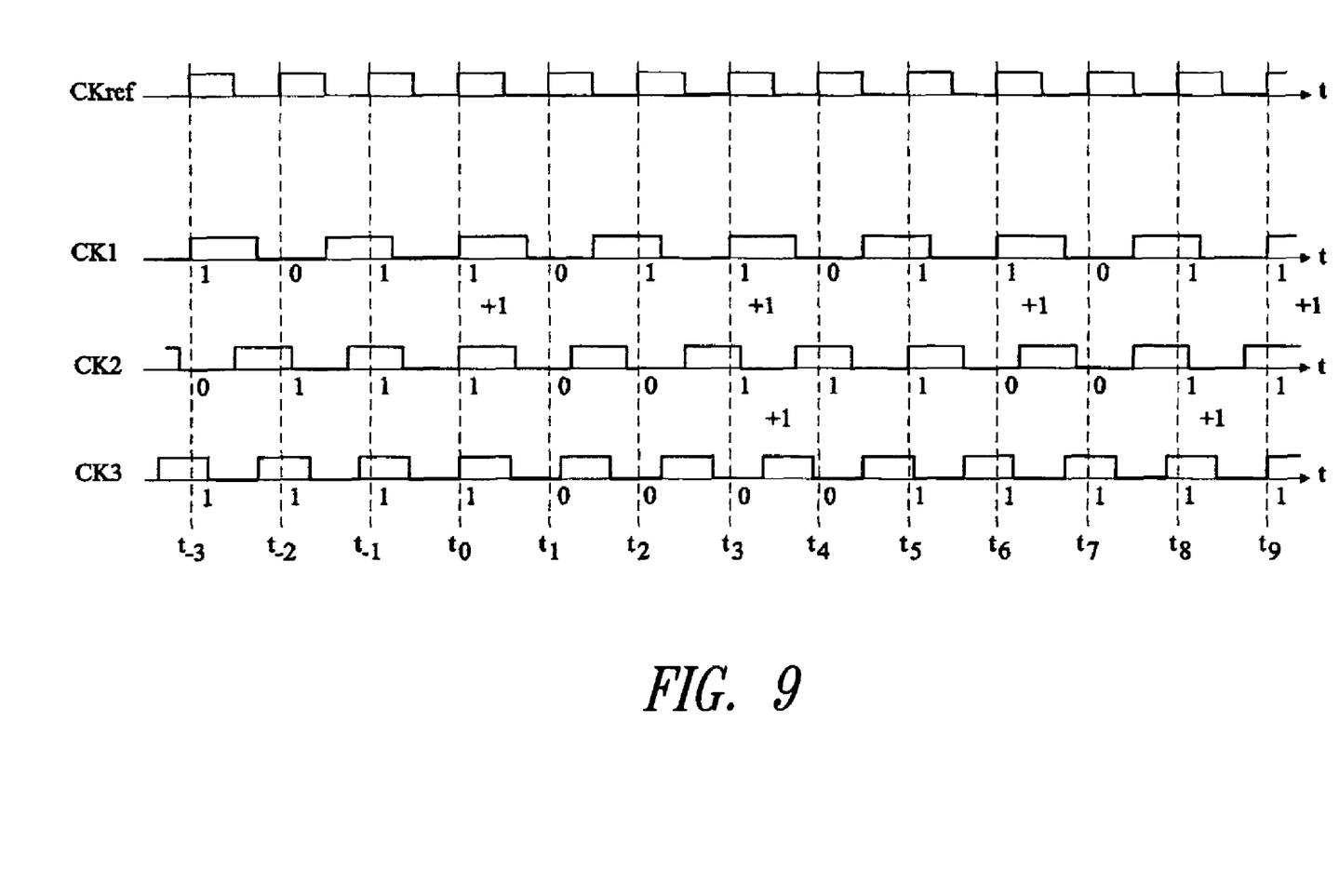
FIG. 9 shows timing diagrams illustrating the operation of an embodiment of a detection circuit.

FIG. 9 illustrates, in the form of timing diagrams, the operation of a detection circuit according to an embodiment. A first timing diagram shows an example of the shape of reference signal CKref. A second timing diagram CK1 shows an example of a signal with a strong jitter. A third timing diagram CK2 shows an example of a signal with an average jitter forming, in this example, the detection threshold in the meaning of an embodiment of the present invention. A fourth timing diagram CK3 shows an example of the shape of a signal of low jitter with respect to the former, considered in this example as acceptable by the estimator of an embodiment of the present invention. A comparison with 4-bit words is assumed, the reference binary pattern (10X1) having an indifferent state (X).

It is assumed that at a time $t_0$, the signals are all synchronous to illustrate the counting performed by an embodiment of the present invention based on the occurrences of the reference pattern in the successive words provided by the shift register (31, FIG. 7). In the example of signal CK1, time $t_0$ is a time when register 31 provides the four states of times $t_{-3}$ to $t_0$ which represent word 1011. Accordingly, the counter is incremented by (+1) from time $t_0$. The next occurrence of pattern 1011 intervenes at time $t_3$, then at time $t_6$ and at time $t_9$. The incrementation of a counter of occurrences of the reference pattern occurs every four clock periods for signal CK1.

Taking the example of signal CK2 having a lower jitter, the first occurrence of a pattern (here 1001) conformal to the reference pattern intervenes at time $t_3$. The next occurrence appears at time $t_8$. The occurrence of the pattern is thus less frequent than for signal CK1.

As for third signal CK3, pattern 10X1 does not appear between times $t_{-3}$ and $t_9$. Assuming that the limiting signal corresponds to signal CK2 and having set in adapted fashion threshold TH and the frequency of reset signal RESET of the two counters, the estimator of an embodiment of the present invention will consider that signal CK3 is acceptable as to its jitter.

Of course, the example of FIG. 9 has been arbitrarily exaggerated to illustrate an embodiment of the present invention. In practice, the jitter of the signal to be measured may not be constant. However, this does not change the above-discussed principle.

Figure 10A:
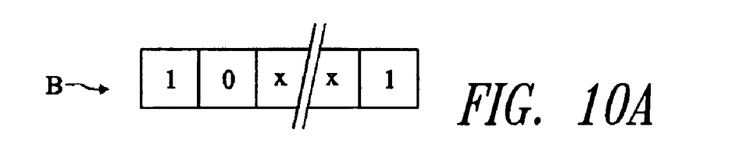
FIGS. 10A and 10B illustrate variations of a detection pattern of an embodiment of a device.

FIG. 10A illustrates an example of a reference pattern D inverse with respect to the pattern illustrated in FIG. 8 and may be used to detect the rising edges instead of the falling edges in the comparison example taken in FIG. 9. It should however be noted that, according to the direction of the comparison between the reference signal and the signal to be measured, the respective states are inverted.

Figure 10B:
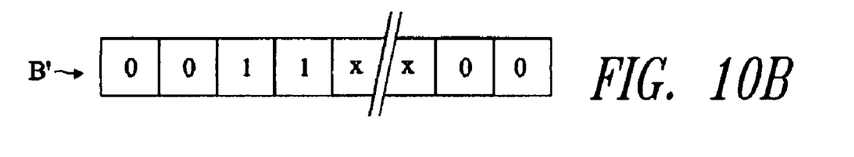

FIG. 10B illustrates a variation B' of the reference word in which the first two bits are in a first state (for example, 0) and the second two bits are in the inverse state (for example, 1), the last two bits reproducing the states of the first two ones. Such a variation enables decreasing the possible uncertainty on the measurement edge if said edge occurs during the state switching of the clock. According to another variation, the start and end states are tripled.

The selection of the number of bits of the reference pattern, of the measurement time with respect to the frequency (period of signal RESET with respect to the frequency of signal CKref) and of threshold TH of comparator 37 may depend, for example, on the characteristics desired for the signal to be measured. The more the size of the reference word increases, the more the estimate is accurate, but the longer it is to provide a reliable result, that is, the more two counter resets (signal RESET) must be spaced apart to make sure to have a signal considered as synchronized. For example, in some embodiments the size of a reference word ranges between 4 and 12 bits, preferably between 5 and 7.

According to the jitter that is considered as acceptable for the electronic circuit, the maximum number of occurrences in the measurement period is set by means of threshold TH of comparator 37. The measurement period is preferentially selected according to the clock signal frequency. For two signals perfectly in phase, the counting will remain theoretically infinitely at zero. In practice, there always exists an offset after some time but this offset is considered as acceptable if it is sufficiently low.

Preferably, the reference clock is approximately selected to have a frequency of the same order of magnitude as the clock of the signal to be measured. The lower the clock frequency is with respect to the frequency of the signal to be measured, the sampling of which it conditions, the longer the measurement time.

The reference clock is either provided from the outside of the circuit, or it originates from a different source inside of this circuit. "Different source" is used, in the example of a phase-locked loop, to designate a signal provided by a voltage-controlled oscillator different from that providing the clock to be measured.

An advantage of an embodiment of the present invention is that it enables estimating the jitter of a clock signal with respect to a reference signal within an electronic circuit without requiring a significant integration surface area with respect to conventional devices only providing data to be exploited from the outside.

Another advantage of an embodiment of the present invention is that it thus makes the estimator compatible with an estimating of the jitter of the manufactured product and is not limited to characterization tests.

Another advantage of an embodiment of the present invention is that it is compatible with a simple digital interpretation (binary state of a flag) of the result of the estimate.

Another advantage of an embodiment of the present invention is that the comparison of the current and reference words can be performed at each period of the reference clock. The fact for everything to be internal and the simplicity of the required circuits (especially, the absence of accumulation other than that of the first n clock cycles by the shift register) makes such a detection possible.

Of course, embodiments of the present invention are likely to have various alterations, improvements, and modifications which will readily occur to those skilled in the art after reviewing this disclosure. In particular, although embodiments of the present invention have been described in relation with a clock signal provided by a phase-locked loop, it more generally applies whatever the source of the clock signal. For example, in an embodiment this signal may be provided by a frequency synthesizer.

Further, although steep edges of the clock signals have been assumed, the triggering of the different flip-flops depends in practice on their structures and on their characteristics in terms of set up time and hold time necessary to record the state.

Moreover, the implementation of embodiments of the present invention is within the abilities of those skilled in the art after review of this disclosure based on the functional indications given hereabove according to the application, especially as concerns the parameterizing of the number of bits of the reference pattern, of the measurement frequency, and of the detection threshold. The number of bits forming the word to be compared with the reference pattern may further comprise all or part of the outputs of the shift register.

Finally, embodiments of the present invention also may be applied to the case where the signal to be measured is subsampled before the shift register. In this case, the reference word is built according to the sampling ratio (even or odd) and comprises a group of one or several first bits in a first state followed by a group of bits in the same state (even sampling ratio) or in the inverse state (odd sampling ratio). The end of the word may be formed of a group of last bits having, for an even sampling ratio, a state depending on the number of intermediary bits between the first and last groups or, for an odd sampling ratio, on a group of bits identical to the first group.

Such alterations, modifications, and improvements are intended to be part of this disclosure, and are intended to be within the spirit and the scope of embodiments of the present invention. Accordingly, the foregoing description is by way of example only and is not intended to be limiting.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for estimating jitter of a first periodic signal with respect to a second periodic signal comprising steps of:
    sampling the first signal by means of the second one;
    providing a result of the sampling to an input of a shift register triggered by the second signal;
    comparing at least two first bits and a last bit of a current word formed from parallel outputs of the shift register with respect to a first reference word; and
    counting a number of occurrences of the first reference word within a given measurement period.

2. The method of claim 1, wherein the number of occurrences is compared with a threshold and is periodically reset, the jitter being considered as acceptable as long as the threshold has not been reached.

3. The method of claim 1, wherein the first and last bits of the first reference word are identical, the second bit of the first reference word being in an inverse state.

4. The method of claim 1, wherein the first reference word comprises between one and three first bits in a first state, between one and three next bits in a second state inverse to the first state, and between one and three last bits in the first state.

5. The method of claim 1, wherein the current word provided by the shift register is compared with a second reference word inverse with respect to the first reference word.

6. The method of claim 1, wherein the measurement period is selected according to a period of the second periodic signal.

7. The method of claim 1, wherein the number of bits of the first reference word ranges between four and twelve.

8. The method of claim 1, wherein the number of bits of the first reference word ranges between five and seven.

9. The method of claim 1, wherein the current word is formed of all the outputs of the shift register.

10. The method of claim 1, wherein the current word is formed of a portion of the outputs of the shift register.

11. A device for estimating a jitter of a periodic signal with respect to a reference signal, comprising:
    a shift register having an input receiving the periodic signal, sampled by the reference signal;
    a first comparator configured to compare a word formed of parallel outputs of the shift register to a reference pattern;
    a first counter configured to count occurrences of a positive comparison provided by the first comparator; and
    a second comparator configured to compare a result of the first counter to a threshold.

12. The device of claim 11 wherein the comparator is configured to compare at least two first bits and a last bit of the word to the reference pattern.

13. The device of claim 11 wherein the first and last bits of the reference pattern are identical, the second bit of the reference pattern being an inverse of the first bit.

14. The device of claim 11 wherein the reference pattern comprises between one and three first bits in a first state, between one and three next bits in a second state inverse to the first state, and between one and three last bits in the first state.

15. The device of claim 11, further comprising:
    a third comparator configured to compare the word to an inverse of the reference pattern; and
    a second counter configured to count occurrences of a positive comparison by the third comparator, wherein the second comparator is further configured to compare a result of the second counter to the threshold.

16. The device of claim 11 wherein the first counter is configured to periodically reset.

17. The device of claim 11 wherein a number of bits of the reference pattern is between five and seven.

18. The device of claim 11 wherein the word is formed of a portion of the outputs of the shift register.

19. The device of claim 11 wherein an output of the second comparator comprises an error signal.

20. An integrated circuit, comprising:
a sampler configured to sample a clock signal;
a pattern detector configured to receive samples from the sampler and to detect occurrences of a pattern in the received samples; and
an error detector coupled to the pattern detector and configured to generate a signal indicative of a jitter of the clock signal with respect to a reference clock signal based on an output of the pattern detector, wherein the pattern detector is configured to compare a set of sampled bits to a set of reference bits and the set of sampled bits comprises a first bit in a word of sampled bits, a second bit in the word and a last bit in the word.

21. The integrated circuit of claim 20, further comprising a clock generator coupled to the reference clock signal and configured to generate the clock signal.

22. The integrated circuit of claim 20 wherein the sampler comprises:
a flip-flop coupled to the clock signal and the reference clock signal; and
a shift registered coupled to an output of the flip-flop.

23. The integrated circuit of claim 20 wherein the sampler comprises:
a plurality of flip-flops coupled together in series; and
a shift register coupled to an output of the plurality of flip-flops.

24. An integrated circuit, comprising:
a sampler configured to sample a clock signal;
a pattern detector configured to receive samples from the sampler and to detect occurrences of a pattern in the received samples; and
an error detector coupled to the pattern detector and configured to generate a signal indicative of a jitter of the clock signal with respect to a reference clock signal based on an output of the pattern, wherein the pattern detector is configured to determine whether a first and last portion of a word of sampled bits are in a first state and a intermediate portion of the word is in a second state, opposite of the first state.

25. The integrated circuit of claim 24 wherein the first portion has a one-bit length, the last portion has a one-bit length and the intermediate portion has a one-bit length, the intermediate portion being adjacent to the first portion.

26. The integrated circuit of claim 24 wherein the first portion has a two-bit length, the last portion has a two-bit length and the intermediate portion has a two-bit length, the intermediate portion being adjacent to the first portion.

27. The integrated circuit of claim 24 wherein the pattern detector is further configured to determine whether the first and last portion are in the second state and the intermediate portion is in the first state.

28. An integrated circuit, comprising:
a sampler configured to sample a clock signal;
a pattern detector configured to receive samples from the sampler and to detect occurrences of a pattern in the received samples; and
an error detector coupled to the pattern detector and configured to generate a signal indicative of a jitter of the clock signal with respect to a reference clock signal based on an output of the pattern, wherein the signal generated by the error detector indicates the jitter is too high when a number of occurrences of the pattern exceeds a threshold number within a period of time.

29. The integrated circuit of claim 28 wherein the pattern detector is configured to detect occurrences of a second pattern in the received samples and the signal generated by the error detector indicates the jitter is too high when a number of occurrences of the second pattern exceeds the threshold number within the period of time.

30. A method of estimating a jitter of a clock signal with respect to a reference clock, comprising:
sampling the clock signal using the reference clock;
detecting occurrences of a first pattern in samples of the clock signal;
generating a signal indicating the jitter of the clock signal with respect to the reference clock is too high when a number of detected occurrences of the pattern exceeds a first threshold value within a first period of time.

31. The method of claim 30 further comprising:
detecting occurrences of a second pattern in the samples of the clock signal; and
generating the signal indicating the jitter is too high when a number of detected occurrences of the second pattern exceeds a second threshold value within a second period of time.

32. The method of claim 31 wherein the second pattern is an inverse of the first pattern, the second threshold value equals the first threshold value and the second period of time equals the first period of time.

33. The method of claim 30 wherein detecting occurrences of a first pattern comprises determining whether a first and last portion of a word of sampled bits are in a first state and a intermediate portion of the word is in a second state, opposite of the first state.

34. The method of claim 33 wherein the first portion of the word has a one-bit length, the last portion of the word has a one-bit length, and the intermediate portion of the word is adjacent to the first portion of the word and has a one-bit length.

35. The method of claim 33 wherein the first portion of the word has a three-bit length, the last portion of the word has a three-bit length, and the intermediate portion of the word is adjacent to the first portion of the word and has a three-bit length.

* * * * *